United States Patent [19]

Bjorke

[11] E Re. 31,551

[45] Reissued Apr. 10, 1984

[54] DIGITAL DELAY GENERATOR

[75] Inventor: Merlin D. Bjorke, Minneapolis, Minn.

[73] Assignee: Honeywell Inc., Minneapolis, Minn.

[21] Appl. No.: 336,009

[22] Filed: Dec. 30, 1981

Related U.S. Patent Documents

Reissue of:

[64] Patent No.: 4,260,912
Issued: Apr. 7, 1981
Appl. No.: 968,535
Filed: Dec. 11, 1978

[51] Int. Cl.[3] ..... H03K 17/296; H03K 17/28; H03K 5/05

[52] U.S. Cl. ..... 307/597; 307/593; 307/602; 307/603; 307/608; 307/267; 307/269; 307/273

[58] Field of Search ..... 307/247 R, 273, 603, 307/604, 600, 602, 592, 593, 595, 597, 267, 269

[56] References Cited

U.S. PATENT DOCUMENTS

| | | | |
|---|---|---|---|
| 3,226,568 | 12/1965 | Samuel | 307/247 R |
| 3,226,577 | 12/1965 | Azuma et al. | 307/273 |
| 3,480,801 | 11/1969 | Smith | 307/604 |
| 3,576,496 | 4/1971 | Garagnon | 307/603 |

FOREIGN PATENT DOCUMENTS

| | | |
|---|---|---|
| 1261146 | 1/1972 | United Kingdom . |
| 1449243 | 9/1976 | United Kingdom . |
| 1529103 | 10/1978 | United Kingdom . |

*Primary Examiner*—John S. Heyman
*Attorney, Agent, or Firm*—John P. Sumner

[57] ABSTRACT

Circuitry for generating a virtually jitter free delay relative to a start pulse and for generating such delays over both integer and non-integer multiples of the time interval between timing pulses. The circuitry includes delay circuitry and signal generating circuitry. The delay circuitry is responsive to the start pulse and to the timing pulses for generating first and second signal edges. The second signal edge occurs later in time than the first signal edge, and both signal edges occur following the start pulse and in timed relation to the timing pulses. The signal generating circuitry is connected to the delay circuitry and has an output for generating an output signal which includes a timing cycle of known duration. The signal generating circuitry is responsive to the start pulse for initiating the timing cycle, the first signal edge for interrupting the timing cycle, and the second signal edge for reinitiating the timing cycle. The output signal begins in timed relation to the start pulse and terminates in timed relation to the end of the timing cycle following interruption.

19 Claims, 2 Drawing Figures

DIGITAL DELAY GENERATOR

Matter enclosed in heavy brackets [ ] appears in the original patent but forms no part of this reissue specification; matter printed in italics indicates the additions made by reissue.

The Government has rights in this invention pursuant to Contract No. DAAB07-77-C-2187 awarded by the Department of the Army.

CROSS REFERENCES TO RELATED APPLICATIONS

Reference should be made to my copending application entitled "Interruptable Signal Generator" which is filed on even date herewith and which is assigned to the same assignee as the present application.

BACKGROUND OF THE INVENTION

1. Field of the Invention

This invention relates to non-synchronous clocked digital delay generator systems and, more particularly, to generating virtually jitter free delays relative to a start pulse and for generating such delays over both integer and non-integer multiples of the time interval between clocked timing pulses.

2. Description of the Prior Art

A typical prior art digital delay generator system generates a delay relative to a start pulse which is unsynchronized to timing pulses counted by the system. Because the start pulse is unsynchronized to the timing pulses, a period of time up to the time interval between timing pulses can occur between receipt of the start pulse and detection by the delay generator system of the first subsequent timing pulse. This uncertainty in time between the occurrence of the start pulse and the first counted timing pulse is commonly referred to as jitter. Accordingly, because the start pulse can occur at any time between adjacent timing pulses, and because the counter will only count at a specific point in the cycle between timing pulses, typically at the leading edge of each timing pulse, a jitter of up to the time interval between adjacent timing pulses will exist in the time delay established by the system.

Another disadvantage of typical digital delay generator systems is that, without supplementary circuitry, the nominal delays available are limited to integer multiples of the time interval between timing pulses. Therefore, nominal delays ending between timing pulses cannot be selected.

SUMMARY OF THE INVENTION

The present invention is a digital delay generator system for generating virtually jitter free delays relative to a start pulse and for generating such delays over both integer and non-integer multiples of the time interval between timing pulses.

The system includes delay apparatus responsive to the start pulse and the timing pulses for generating first and second signal edges, the second signal edge occurring later in time than the first signal edge, both signal edges occurring following the start pulse and in timed relation to the timing pulses.

The system also includes signal generating apparatus connected to the delay apparatus. The signal generating apparatus has an output for generating an output signal which includes a timing cycle of known duration. The signal generating apparatus is responsive to the start pulse for initiating the timing cycle, the first signal edge for interrupting the timing cycle and the second signal edge for reinitiating the timing cycle. The output signal begins in timed relation to the start pulse and terminates in timed relation to the end of the timing cycle following interruption.

DESCRIPTION OF THE PREFERRED EMBODIMENT

Structure

Figure 1:
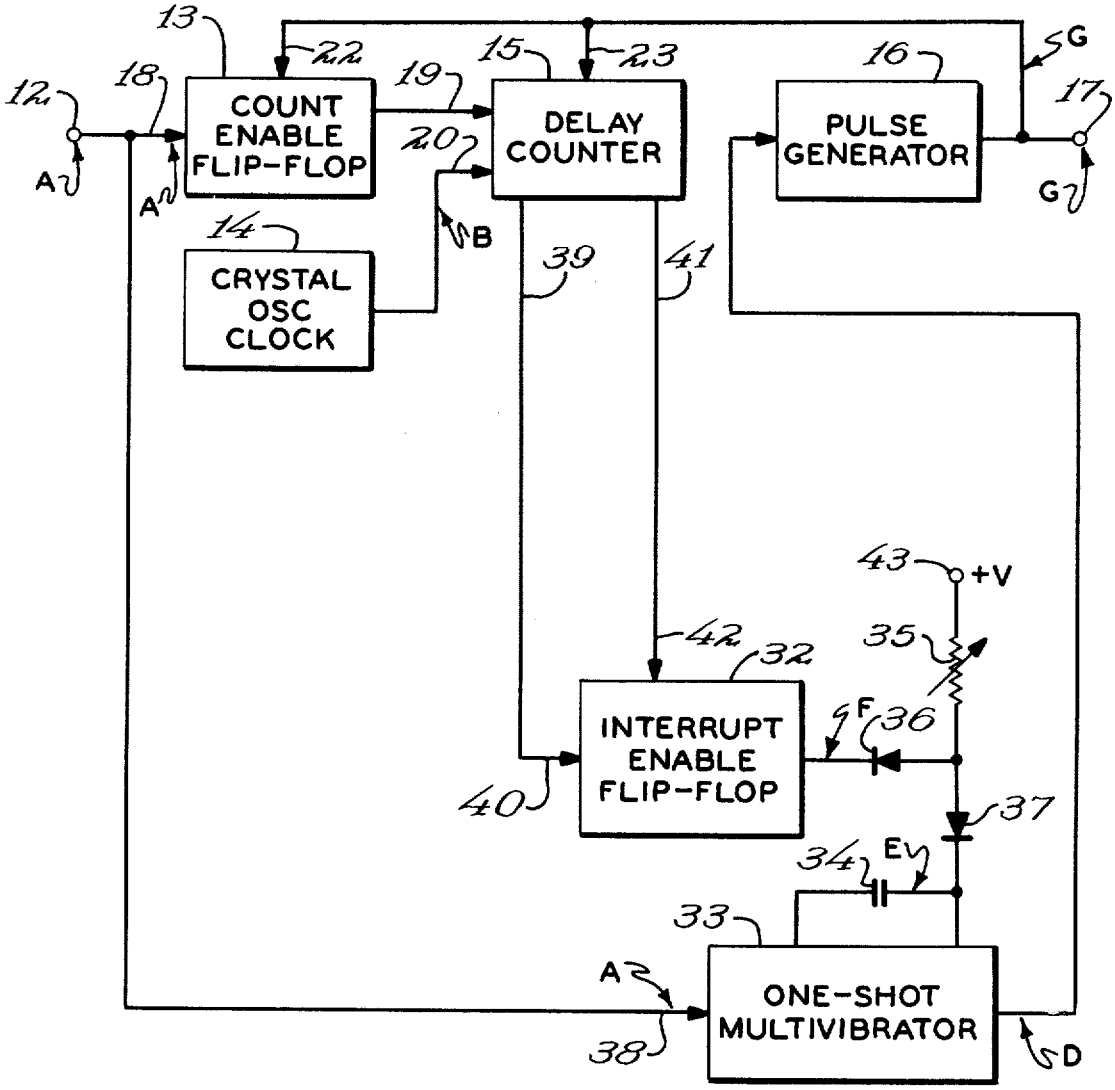
FIG. 1 is a diagram illustrating the preferred embodiment of the present invention.

Referring now more particularly to FIG. 1 and to the details of the present invention, the network can be seen to include an input terminal 12, a count enable flip-flop 13, a crystal oscillator clock 14, a delay counter 15, an interrupt enable flip-flop 32, a one-shot multivibrator ("one-shot") 33, a capacitor 34, two diodes 36 and 37, a variable resistor 35, a supply voltage terminal 43, a pulse generator 16, and an output terminal 17.

Input terminal 12 is connected to input 18 of count enable flip-flop 13 and to input 38 of one-shot 33.

The output of count enable flip-flop 13 is connected to an input 19 of delay counter 15. The output of crystal oscillator clock 14 is connected to an input 20 of delay counter 15.

Two outputs 39 and 41 of delay counter 15 are connected to two inputs 40 and 42, respectively, of interrupt enable flip-flop 32.

The output of interrupt enable flip-flop 32 and a first timing input of one-shot 33 are connected through diodes 36 and 37 which are connected and oriented for forward current flow away from each other. Capacitor 34 is connected between the first timing input of one-shot 33 and a second timing input of one-shot 33. Capacitor charging current is derived from supply voltage terminal 43 which is connected through variable resistor 35 to a junction between diodes 36 and 37.

In the configuration shown in FIG. 1, the output of one-shot 33 is connected to the input of pulse generator 16, and the output of pulse generator 16 is connected to output terminal 17 as well as to a reset input 22 of count enable flip-flop 13 and to a reset input 23 of delay counter 15. In an alternate configuration, pulse generator 16 can be eliminated, and the output of one-shot 33 can be connected directly to output terminal 17 as well as to input 22 of count enable flip-flop 13 and to input 23 of delay counter 15. In this alternate configuration, count enable flip-flop 13 and delay counter 15 must be of the type that will reset on a specific signal edge (transition) rather than on a signal level.

Count enable flip-flop 13 and interrupt enable flip-flop 32 can be comprised of an SN5474, which is a dual integrated circuit; one-shot 33 and pulse generator 16 can comprise an SN54123, which is also a dual integrated circuit; and delay counter 15 can comprise at least one SN54197. These integrated circuits may be found in any TTL data book.

Operation

Figure 2:
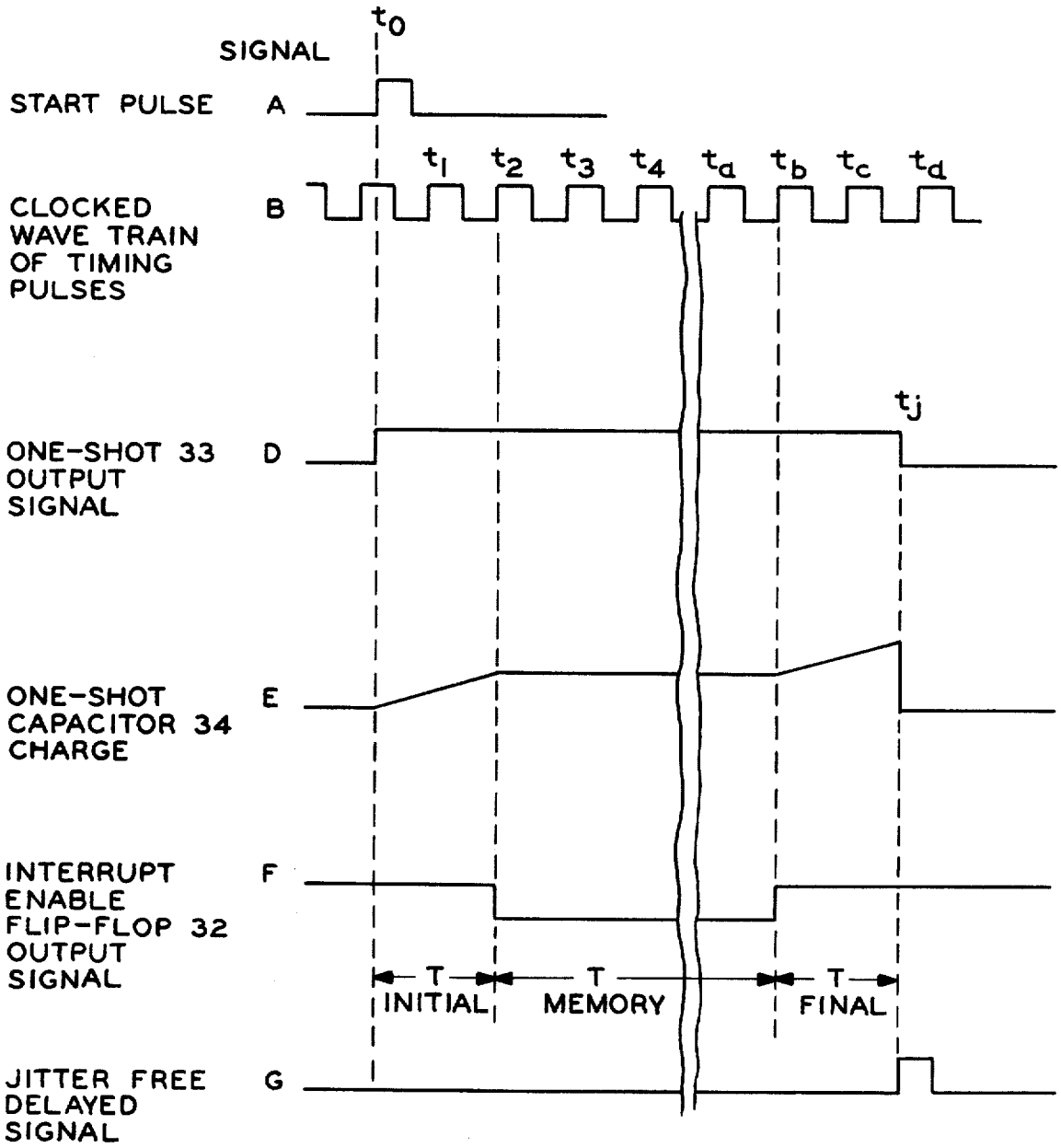
FIG. 2 illustrates signals appearing at various points in the circuit of FIG. 1.

Referring now to the signals illustrated in FIG. 2, the operation of the present invention will be described.

Non-synchronous start pulse A is received at terminal 12 and at input 18 of count enable flip-flop 13. Start pulse A toggles count enable flip-flop 13 which then enables delay counter 15 to begin counting the timing pulses as soon thereafter as they are received from crystal oscillator clock 14 which is continuously running.

Following receipt at terminal 12, start pulse A is transmitted not only to input 18 of count enable flip-flop 13 but also to input 38 of one-shot 33. One-shot 33 then begins generating an output signal with a timing cycle having a duration predetermined primarily by the values of capacitor 34 and variable resistor 35.

If one-shot 33 were not interrupted, the timing cycle would continue without interruption over the time it takes for the charging current to charge capacitor 34 to a predetermined threshold at which time the output signal of one-shot 33 would terminate. Accordingly, at time $t_o$ when start pulse A is received at input 38 of one-shot 33, the one-shot output signal begins (see signal D) as the potential across capacitor 34 begins to rise (see signal E).

On a specific early count from delay counter 15 (the beginning of the second timing pulse at $t_2$ on clock wave train B is optimum) an interrupt enable command comprising at least a first signal edge is received from output 39 of delay counter 15 (e.g., from the $Q_A$ output of an SN54197) by input 40 of interrupt enable flip-flop 32, causing the interrupt enable flip-flop output signal to go from high to low as shown at time $t_2$ in signal F. This low output signal at the output of interrupt enable flip-flop 32 then shunts the one-shot charging current from supply voltage terminal 43 through variable resistor 35 and diode 36 into the output of interrupt enable flip-flop 32 through a transistor leg to ground.

With the capacitor charging current thus shunted, one-shot 33 is effectively in a "memory" mode since no charge or discharge path exists for capacitor 34 (diode 36 prevents any charging of capacitor 34 by the normal output of interrupt enable flip-flop 32, and diode 37 prevents any discharge of capacitor 34). Thus, one-shot 33 will not continue its timing cycle until interrupt enable flip-flop 32 is reset as disccused further below.

Although the means including diodes 36 and 37 could have been constructed in a wide variety of ways, including through the use of transistors, the use of diodes was selected.

On a predetermined later timing pulse corresponding to a desired delay, a clocked reset signal comprising at least a second signal edge is received from output 41 of delay counter 15 by input 42 of interrupt enable flip-flop 32. Receipt of the reset signal causes interrupt enable fip-flop 32 to be reset and its output to return high as shown at time $t_b$ in signal F.

With interrupt enable flip-flop 32 in its reset state, the high output signal precludes further shunting of the capacitor charging current to ground. Thus, capacitor 34 once again begins charging (see signal E at time $t_b$), and one-shot 33 resumes the remaining portion of its timing cycle. The remaining portion will be its normal full cycle time less the amount of time that occurred between start pulse A at time $t_o$ and the clocked interrupt enable command at time $t_2$.

The timing cycle of one-shot 33 ends when the charge on capacitor 34 reaches a predetermined threshold. At this time, as illustrated at time $t_j$ in FIG. 2, capacitor 34 discharges (see signal E) and the one-shot 33 output signal terminates (see Signal D).

Time $t_j$ at the trailing edge of signal D is a virtually jitter free time, precisely delayed from time $t_o$ at the leading edges of input start pulse A and signal D. As desired and as shown by the apparatus illustrated in FIG. 1, the trailing edge of output signal D may be used to trigger generation of a delayed signal G by way of pulse generator 16. Signal G is made available through output terminal 17. In addition, as desired, delayed signal G can also be routed to input 22 of count enable flip-flop 13 and to input 23 of delay counter 15 for the purpose of resetting these devices. With this arrangement, which is also illustrated in FIG. 1, count enable flip-flop 13 and delay counter 15 are reset in response to delayed signal G.

In the alternative, as was previously described, pulse generator 16 can be eliminated, and the output of one-shot 33 can be connected directly to output terminal 17. In this manner, the trailing edge of signal D is used directly for timing purposes. In addition, as desired, the output of one-shot 33 can be connected directly to input 22 of count enable flip-flop 13 and to input 23 of delay counter 15 such that these devices will be reset in response to the trailing edge of signal D.

The time between $t_o$ and $t_j$ is equal to the one-shot 33 cycle time plus the time determined by the integer multiple of the timing pulses which occur during the time that one-shot 33 is in its "memory" mode. Accordingly, as shown in FIG. 2, the total delay time between time $t_o$ and $t_j$ is the total of time periods $T_{INITIAL}$, $T_{MEMORY}$, and $T_{FINAL}$.

$T_{INITIAL}$ is the first portion of the one-shot 33 timing cycle. It occurs between time $t_o$ at the leading edge of start pulse A and time $t_2$ when the interrupt enable command toggles interrupt enable flip-flop 32, thus causing the one-shot 33 timing cycle to be interrupted.

$T_{MEMORY}$ is the time period during which the one-shot 33 timing cycle is effectively in a "memory" mode. It is the time period between time $t_2$ when the one-shot 33 timing cycle is interrupted and time $t_b$ when the clocked reset signal resets interrupt enable flip-flop 32, thus recommencing the charging of capacitor 34 and the timing of the one-shot 33 timing cycle. $T_{MEMORY}$ is equal to an exact multiple of the time interval between adjacent timing pulses since both the interrupt enable command and the reset signal are clocked, occurring at the leading edges of timing pulses.

$T_{FINAL}$ is the final or remaining portion of the one-shot 33 timing cycle and is equal to the normal one-shot 33 cycle time less the amount of time that occurs during $T_{INITIAL}$. It occurs between time $t_b$ when the reset signal resets interrupt enable flip-flop 32, thus causing the one-shot 33 timing cycle to resume, and time $t_j$ when one-shot 33 reaches the end of its timing cycle.

The selection of times $t_2$ and $t_b$ is, of course, arbitrary and can be varied according to design considerations and applications. A primary concern is to have the time period between times $t_o$ and $t_2$ and the time period between times $t_b$ and $t_j$ long enough so that any transients arising at times $t_o$ and $t_b$ will have suitably stabilized by times $t_2$ and $t_j$, respectively.

The frequency of crystal oscillator clock 14 can also, of course, vary according to application. In two different applications of the present invention, a 10 megahertz clock (each clock period having 100 nanoseconds) and a 20 megahertz clock (each clock period having 50 nanoseconds) have been used.

The normal full timing cycle of one-shot 33 ($T_{INITIAL}$ plus $T_{FINAL}$) can vary from as short a time as two clock periods to as long a time as one might desire. Timing cycles as long as microseconds have been experimented with. In two different applications of the present invention, timing cycles were nominally 350 nanoseconds and were adjustable by approximately one clock period. (In the embodiment shown in FIG. 1, the timing cycle of one-shot 33 is made adjustable through the use of variable resistor 35. Note that, in addition to or in the alternative to using a variable resistor 35 to adjust the timing cycle a variable capacitor could be used in lieu of capacitor 34.)

By having the timing cycle of one-shot 33 adjustable, the total time delay between $t_o$ and $t_j$ is not only virtually jitter free but is susceptible to precise refinement as well. It may be desired, for example, to have a total time delay equal to an integer multiple of the time interval between timing pulses. Such a result can be achieved by setting the timing cycle of one-shot 33 equal to an integer multiple of the clock period, e.g., 350 nanoseconds for a 20 megahertz clock having a 50 nanosecond clock period. In such a case, the total delay will be 350 nanoseconds ($T_{INITIAL}$ plus $T_{FINAL}$) plus $T_{MEMORY}$, which is determined by the integer multiple of clock periods of delay which occur during the time that one-shot 33 is in its "memory" mode.

On the other hand, total delay times other than integer multiples of the clock period may be desired. If in a system with a 100 megahertz clock having a 100 nanosecond clock period one desired a total delay of an integer multiple of clock periods plus 40 nanoseconds, one could set the timing cycle of one-shot 33 ($T_{INITIAL}$ plus $T_{FINAL}$) to, for example, 340 nanoseconds. The total time delay would then be equal to 340 nanoseconds ($T_{INITIAL}$ plus $T_{FINAL}$) plus whatever $T_{MEMORY}$ integer multiple of 100 nanosecond clock periods are selected.

$T_{MEMORY}$, the time during which one-shot 33 is interrupted and held in its "memory" mode, can be as long as desired. In two applications of the present invention, $T_{MEMORY}$ was approximately 52 microseconds.

In the preceding discussion, times have generally been referred to as occurring at particular times such as $t_0$, $t_2$, $t_b$, and $t_j$. In reality, of course, there is virtually always some inherent delay within the components of a system as well as over signal rise times. If all such delays are equal or are known, the resulting uncertainty, if significant, can be accounted for. In addition, of course, one can insert known delays in timed relation to times such as those mentioned above and still have an equivalent system since the effect of such delays can be accounted for.

The embodiments of the invention in which an exclusive property or right is claimed are defined as follows:

1. A digital delay generator for generating a virtually jitter free delay relative to a start pulse and for generating such a delay over any practicable multiple of the time interval between timing pulses, such multiple including a non-integer, comprising:

delay means responsive to the start pulse and to the timing pulses for generating first and second signal edges, the second signal edge occurring later in time than the first signal edge, both signal edges occurring following the start pulse and in timed relation to the timing pulses; and signal generating means connected to the delay means and having an output for generating an output signal which includes a timing cycle of a fixed known duration, the signal generating means [being] *comprising means* responsive to (*1*) the start pulse for initiating the timing cycle *in timed relation to the start pulse*, (*2*) the first signal edge for interrupting the timing cycle [for an indefinite period] *to initiate a hold thereon*, and (*3*) the second signal edge for reestablishing the timing cycle and permitting the timing cycle to continue, [the output signal] *the signal generating means further comprising means for* beginning *the output signal* in timed relation to the [start pulse] *beginning of the timing cycle* and *for* terminating *the output signal* in timed relation to the end of the timing cycle following interruption, so that a virtually jitter free delay with respect to the start pulse is generated.

2. Apparatus according to claim 1 wherein the signal generating means further comprises:

first means for initiating the timing cycle in timed relation to the start pulse and for providing the output signal, the first means being connected to receive the start pulse and;

second means for interrupting the timing cycle in timed relation to the first signal edge and for reinitiating the timing cycle in timed relation to the second signal edge, the second means being connected to the delay means and to the first means.

3. Apparatus according to claim 2 wherein the first means comprises a one-shot multivibrator having an input for receiving the start pulse and an output for providing the output signal, the one-shot multivibrator also having a timing capacitor connected between a first timing input and a second timing input.

4. Apparatus according to claim 3 wherein the second means comprises an interrupt enable flip-flop having an output connected to a third means for selectively permitting the charging of the capacitor, the third means being connected to the capacitor, and wherein the interrupt enable flip-flop is connected to receive the first and second signal edges, the interrupt enable flip-flop output having a normal first signal level ending in response to the first signal edge and recommencing in response to the second signal edge, and having a second signal level between the ending and recommencing of the first signal level, the charging of the capacitor occurring following the start pulse while the first signal level is present until the capacitor charge reaches a known level, the timing cycle ending in timed relation to the time that the capacitor reaches the known charge level.

5. Apparatus according to claim 4 wherein the third means includes a resistor through which the capacitor is charged.

6. Apparatus according to claim 5 wherein the third means further comprises two diodes connected for current flow away from each other, the diodes being connected betweeen the interrupt enable flip-flop output and the timing capacitor and wherein one end of the resistor is connected to a junction between the two diodes, the other end of the resistor being connected to a terminal adapted to receive a supply voltage.

7. Apparatus according to claim 6 further comprising timing pulse supply means for providing the timing pulses, the timing pulse supply means being connected to the delay means.

8. Apparatus according to claim 7 further comprising enable means for enabling the delay means to be responsive to the start pulse, the enable means being connected to receive the start pulse and connected to the delay means.

9. Apparatus according to claim 8 wherein the delay means comprises a delay counter having a first input connected to an output of the enable means, a second input connected to receive the timing pulses, a first output for providing the first signal edge, and a second output for providing the second signal edge.

10. Apparatus according to claim 9 wherein the interrupt enable flip-flop further comprises a first input connected to receive the first signal edge and a second input connected to receive the second signal edge.

11. Apparatus according to claim 10 wherein the enable means and the delay counter further comprise reset means for resetting the enable means and the delay counter, the reset means being connected to the one-shot multivibrator output through an output means, the output means being connected to an output terminal.

12. Apparatus according to claim 11 wherein the output means comprises pulse generating means having an output for providing a delayed signal in response to the termination of the output signal, the pulse generating means output being connected to the reset means and to the output terminal.

13. Apparatus according to claim 1 further comprising timing pulse supply means for providing the timing pulses, the timing pulse supply means being connected to the delay means.

14. Apparatus according to claim 13 further comprising enable means for enabling the delay means to be responsive to the start pulse, the enable means being connected to receive the start pulse and connected to the delay means.

15. Apparatus according to claim 14 wherein the delay means comprises a delay counter having a first input connected to an output of the enable means, a second input connected to receive the timing pulses, a first output for providing the first signal edge, and a second output for providing the second signal edge.

16. Apparatus according to claim 2 further comprising timing pulse supply means for providing the timing pulses, the timing pulse supply means being connected to the delay means.

17. Apparatus according to claim 16 further comprising enable means for enabling the delay means to be responsive to the start pulse, the enable means being connected to receive the start pulse and connected to the delay means.

18. Apparatus according to claim 17 wherein the delay means comprises a delay counter having a first input connected to an output of the enable means, a second input connected to receive the timing pulses, a first output for providing the first signal edge, and a second output for providing the second signal edge.

19. A method for generating a virtually jitter free delay relative to a start pulse and for generating such a delay over any practicable multiple of the time interval between timing pulses, such multiple including a non-integer, comprising:

generating first and second signal edges in timed relation to timing pulses, the second signal edge occurring later in time than the first signal edge, both signal edges occurring following the start pulse;

generating a signal in response to the start pulse, the signal including a timing cycle of a [fix] *fixed* known duration, the [signal] *timing cycle* beginning in timed relation to the start pulse;

interrupting the timing cycle [for an indefinite period] *to initiate a hold thereon*, the interruption [being] *beginning* in response to the first signal edge;

reestablishing the timing cycle in response to the second signal edge, thus permitting the timing cycle to continue, the signal *beginning in timed relation to the beginning of the timing cycle* terminating in timed relation to the end of the timing cycle following interruption, so that a virtually jitter free delay with respect to the start pulse is generated.

* * * * *

UNITED STATES PATENT OFFICE

CERTIFICATE OF CORRECTION

PATENT NO. : RE 31,551

DATED : April 10, 1984

INVENTOR(S) : Merlin D. Bjorke

It is certified that error appears in the above-identified patent and that said Letters Patent are hereby corrected as shown below:

Column 8, line 34, after "beginning of the timing cycle" insert --and--.

Signed and Sealed this

*Twenty-sixth* Day of *June 1984*

[SEAL]

*Attest:*

GERALD J. MOSSINGHOFF

*Attesting Officer*

*Commissioner of Patents and Trademarks*